(12) United States Patent
Kim et al.

(10) Patent No.: US 9,378,837 B2
(45) Date of Patent: *Jun. 28, 2016

(54) METHOD OF PROVIDING AN OPERATING VOLTAGE IN A MEMORY DEVICE AND A MEMORY CONTROLLER FOR THE MEMORY DEVICE

(71) Applicant: SAMSUNG ELECTRONICS CO., LTD., Gyeonggi-do (KR)

(72) Inventors: Moo Sung Kim, Gyeonggi-do (KR); Wook Ghee Hahn, Jeollanam-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/805,176

(22) Filed: Jul. 21, 2015

(65) Prior Publication Data

US 2015/0325304 A1      Nov. 12, 2015

Related U.S. Application Data

(63) Continuation of application No. 14/458,453, filed on Aug. 13, 2014, now Pat. No. 9,129,697, which is a continuation of application No. 13/892,427, filed on May 13, 2013, now abandoned, which is a continuation of application No. 13/289,282, filed on Nov. 4, 2011, now Pat. No. 8,441,856.

(30) Foreign Application Priority Data

Nov. 11, 2010   (KR) .................... 10-2010-0112110

(51) Int. Cl.
*G11C 16/26*    (2006.01)
*G11C 11/56*    (2006.01)
(Continued)

(52) U.S. Cl.
CPC ............ *G11C 16/26* (2013.01); *G11C 11/5642* (2013.01); *G11C 16/0483* (2013.01); *G11C 16/10* (2013.01)

(58) Field of Classification Search
CPC ............... G11C 16/0483; G11C 16/26; G11C 11/5642; G11C 16/10; G11C 16/3418; G11C 11/5628; G11C 13/004; G11C 16/12
USPC ............. 365/185.17–185.19, 185.11–185.12, 365/185.21–185.23
See application file for complete search history.

(56) References Cited

U.S. PATENT DOCUMENTS 7,272,043 B2    9/2007   Liao et al.
7,613,068 B2    11/2009  Mokhlesi
(Continued)

FOREIGN PATENT DOCUMENTS

JP    2009-117018    5/2009
JP    2010-086628    4/2010
(Continued)

*Primary Examiner* — David Lam
(74) *Attorney, Agent, or Firm* — F. Chau & Associates, LLC

(57) ABSTRACT

A method of providing an operating voltage in a memory device includes applying a read voltage to a selected word line while applying a first pass voltage to at least one unselected word line among word lines adjacent to the selected word line; and while applying a second pass voltage to the remaining unselected word lines (other than the at least one unselected word line to which the first pass voltage is applied). The level of the first pass voltage is higher than the level of the second pass voltage. The level of the first pass voltage may be set based on the level of the read voltage.

20 Claims, 14 Drawing Sheets

(51) Int. Cl.
  *G11C 16/04* (2006.01)
  *G11C 16/10* (2006.01)

(56) References Cited

U.S. PATENT DOCUMENTS

| | | |
|---|---|---|
| 7,701,784 B2 | 4/2010 | Maejima et al. |
| 7,800,952 B2 | 9/2010 | Lee |
| 7,916,547 B2 * | 3/2011 | Hosono .............. G11C 11/5642 365/185.02 |
| 7,965,555 B2 | 6/2011 | Namiki et al. |
| 8,004,896 B2 | 8/2011 | Joo |
| 8,023,327 B2 | 9/2011 | Futatsuyama |
| 8,116,135 B2 | 2/2012 | Aritome |
| 8,179,718 B2 | 5/2012 | Cho et al. |
| 8,441,856 B2 * | 5/2013 | Kim .................. G11C 11/5642 365/185.17 |
| 9,129,697 B2 * | 9/2015 | Kim .................. G11C 11/5642 |
| 2009/0073763 A1 | 3/2009 | Hosono |
| 2009/0238007 A1 | 9/2009 | Jang |
| 2010/0124119 A1 | 5/2010 | Lee et al. |
| 2014/0347935 A1 | 11/2014 | Kim et al. |

FOREIGN PATENT DOCUMENTS

| | | |
|---|---|---|
| JP | 2010086628 | 4/2010 |
| KR | 20090002483 | 1/2009 |
| KR | 1020090100077 | 9/2009 |
| KR | 1020100054566 | 5/2010 |
| KR | 1020100054566 | 6/2010 |
| KR | 1020100087806 | 8/2010 |

* cited by examiner

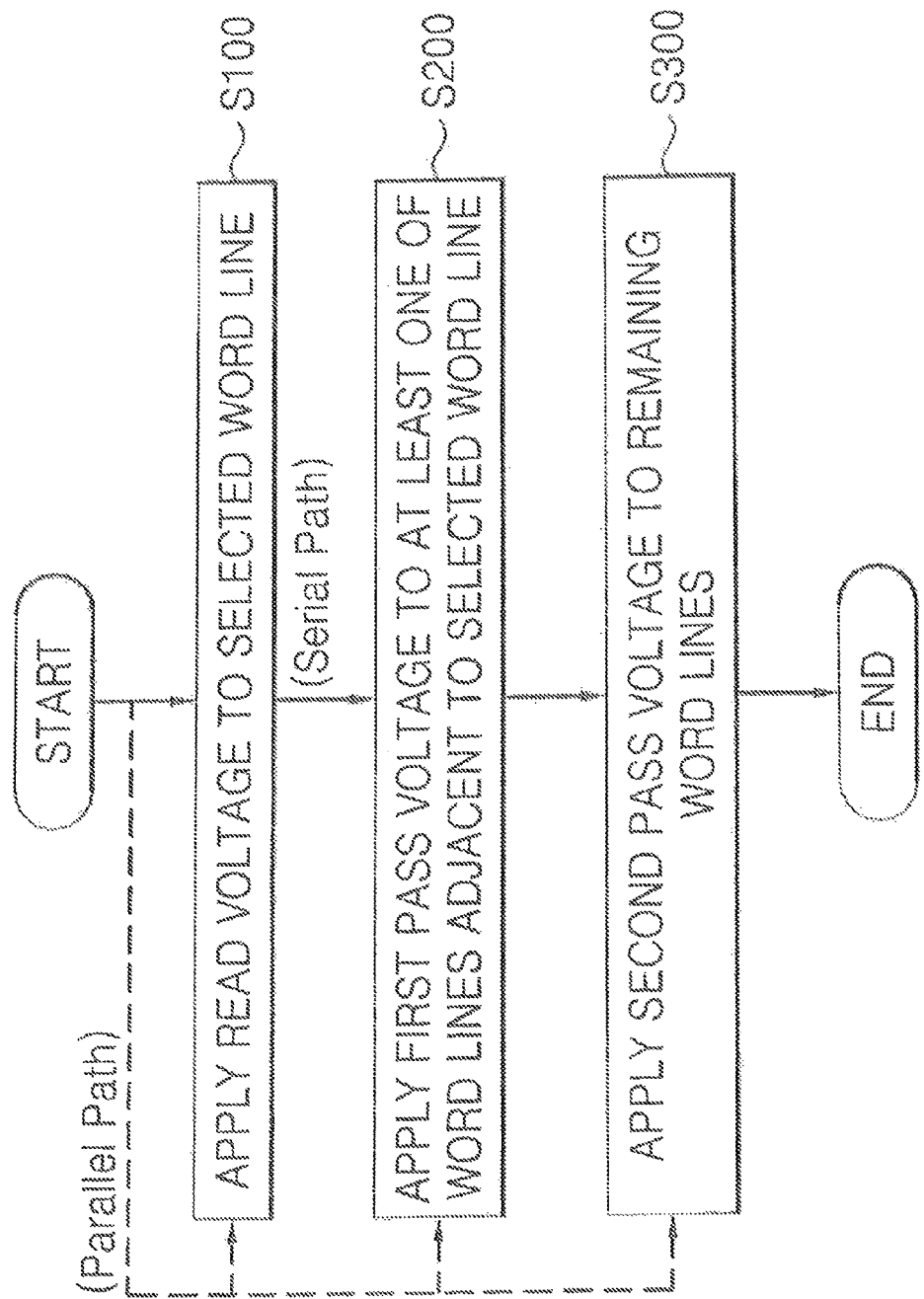

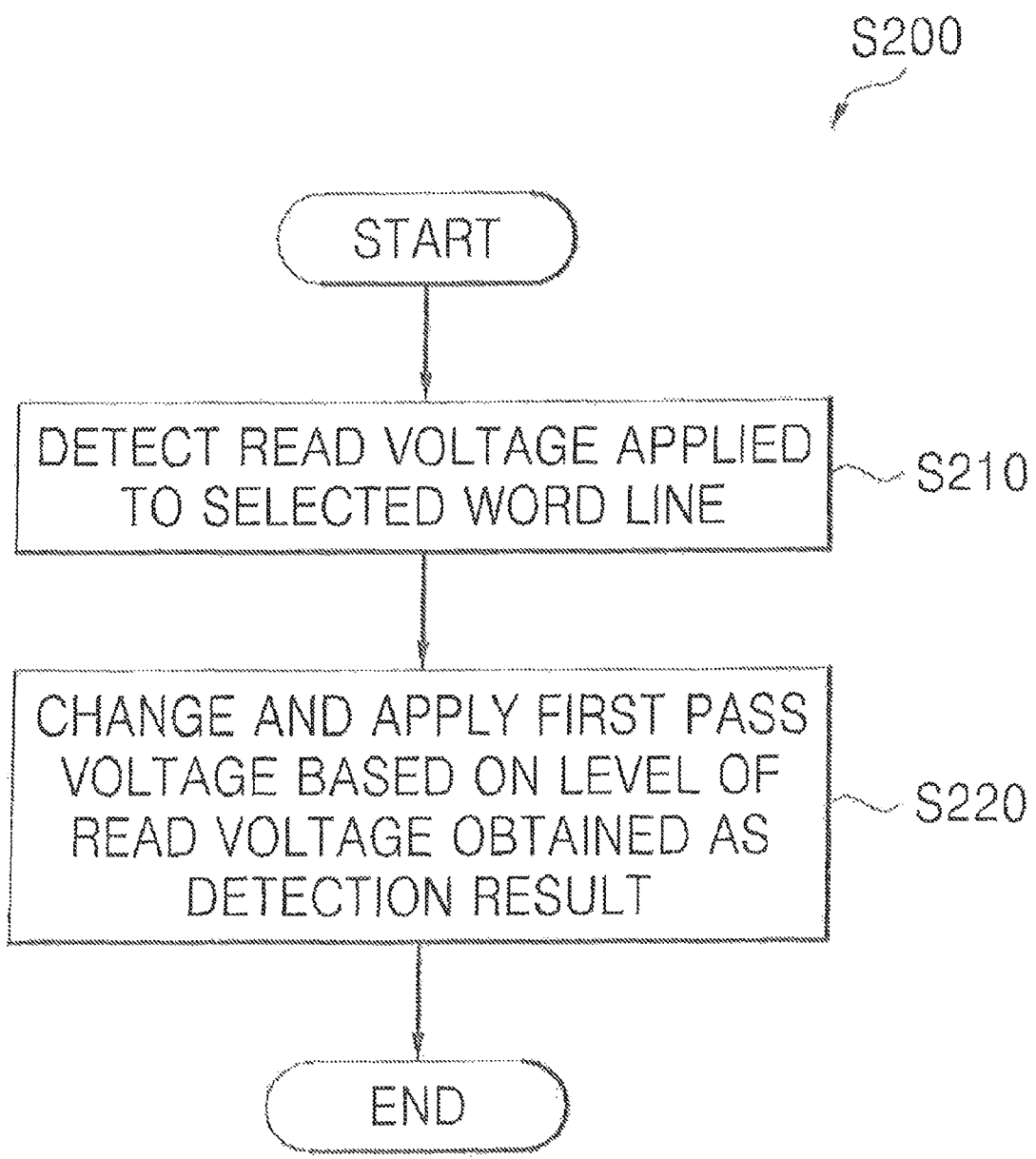

METHOD OF PROVIDING AN OPERATING VOLTAGE IN A MEMORY DEVICE AND A MEMORY CONTROLLER FOR THE MEMORY DEVICE

CROSS-REFERENCE TO RELATED APPLICATIONS

This application is a Continuation of U.S. application Ser. No. 14/458,453 filed on Aug. 13, 2014, now U.S. Pat. No. 9,129,697, which is a Continuation of U.S. Ser. No. 13/892,427 filed on May 13, 2013, which is a Continuation of U.S. application Ser. No. 13/289,282 filed on Nov. 4, 2011, now U.S. Pat. No. 8,441,856, which claims priority under 35 U.S.C. 119 to Korean Patent Application No. 10-2010-0112110 filed on Nov. 11, 2010, the disclosures of which are incorporated by reference herein in their entireties.

BACKGROUND OF THE INVENTIVE CONCEPT

1. Technical Field

The present inventive concept relates to a method of providing an operating voltage in a memory device and a memory controller, and more particularly to a method of controlling an operating voltage applied to an unselected word line in a memory device.

2. Discussion of the Related Art

After an erase/program operation is performed on a selected memory cell in a memory device, a trap charge occurs at an edge of a tunnel isolation layer in the memory transistor of the selected memory cell. The increase of the trap charge causes a decrease of memory cell current and an increase of the threshold voltage for turning the memory transistor of the selected memory cell ON. In other words, after the erase/program operation of the memory device, the threshold voltage of memory cells increases, expanding a threshold voltage distribution.

In a read operation, a read voltage $V_{READ}$ is applied to a selected word line connected to a memory cell from which data will be read and a pass voltage $V_{PASS}$ is applied to unselected word lines (i.e., word lines other than the selected word line) to turn ON memory cells connected to the unselected word lines.

At this time, when the threshold voltage of a memory cell is lower than that of adjacent memory cells, an electric field applied to a tunnel isolation layer of the memory cell having the lower threshold voltage is reduced by the memory cells having the higher threshold voltage.

As a result, the threshold voltage distribution of the memory cell having the lower threshold voltage is more expanded.

SUMMARY

Some embodiments of the present inventive concept provide a method of providing an operating voltage in a memory device, thereby improving the characteristic of the threshold voltage distribution of memory cells, and a memory controller.

According to some embodiments of the present inventive concept, there is provided a method of providing an operating voltage in a memory device. The method includes the steps of applying a read voltage to a selected word line; applying a first pass voltage to at least one word line among word lines adjacent to the selected word line; and applying a second pass voltage to word lines other than the selected word line and the at least one word line to which the first pass voltage is applied. The level of the first pass voltage may be higher than the level of the second pass voltage.

The steps of applying the first pass voltage may include changing the level of the first pass voltage and applying the first pass voltage at a different level according to the level of the read voltage.

The changing and applying the first pass voltage may include setting the level difference between the first pass voltage and the read voltage to a predetermined value.

The read voltage may include a verify read voltage used in incremental step pulse programming (ISPP) and a read voltage used in a read operation.

When the read voltage comprises a minus voltage, the changing and applying the first pass voltage may include applying the first pass voltage at different levels according to whether the read voltage is the minus voltage or not.

According to other embodiments of the present inventive concept, there is provided a memory device including a voltage generator configured to provide an operating voltage necessary for an operation of the memory device to a memory array; and a chip controller configured to control the voltage generator to apply a read voltage to a selected word line in the memory array, to apply a first pass voltage to at least one word line among unselected word lines adjacent to the selected word line, and to apply a second pass voltage to unselected word lines (other than the at least one word line to which the first pass voltage is applied). The level of the first pass voltage may be higher than the level of the second pass voltage.

The chip controller may control the voltage generator to change the level of the first pass voltage and apply the first pass voltage at a different level based on the level of the read voltage.

The chip controller may control the voltage generator to set the level difference between the first pass voltage and the read voltage to a predetermined value.

According to further embodiments of the present inventive concept, there is provided a memory system including a memory device; and a memory controller configured to control the memory device to apply a read voltage to a selected word line in the memory device, apply a first pass voltage to at least one word line among word lines adjacent to the selected word line, and apply a second pass voltage to word lines other than the selected word line and the at least one word line to which the first pass voltage is applied.

The memory device may include a memory array and a voltage generator configured to provide an operating voltage necessary for an operation of the memory device to the memory array based on control of the memory controller.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

BRIEF DESCRIPTION OF THE DRAWINGS

The above and other features of the present inventive concept will become more apparent by describing in detail exemplary embodiments thereof with reference to the attached drawings in which:

FIG. 9A is a flowchart of a method of providing an operating voltage in a semiconductor memory device according to some embodiments of the present inventive concept;

FIG. 9B is a flowchart detailing substeps of applying a first pass voltage in the method of FIG. 9A;

DETAILED DESCRIPTION OF THE EXEMPLARY EMBODIMENTS

Figure 1:
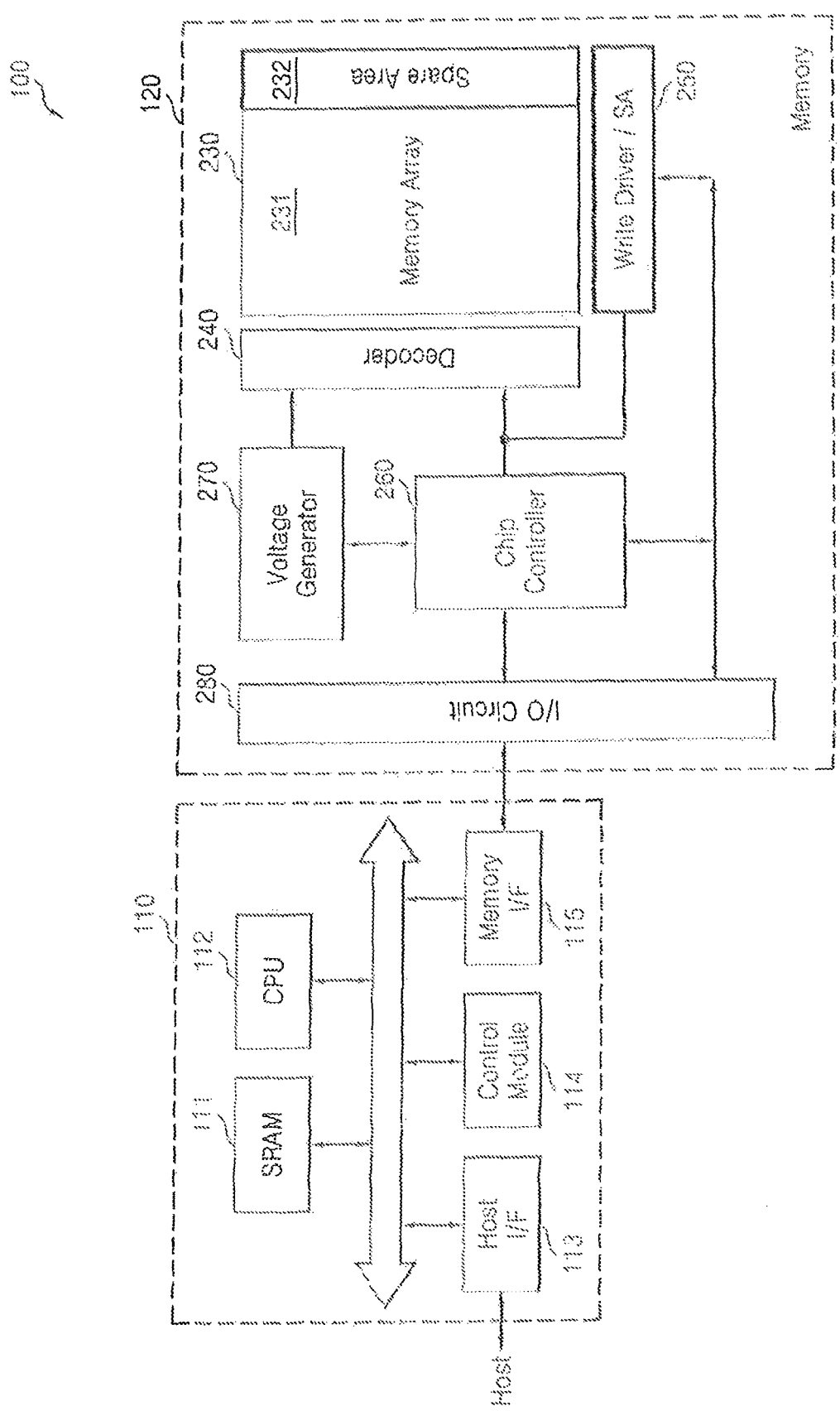
FIG. 1 is a block diagram of a non-volatile memory system according to some embodiments of the present inventive concept.

FIG. 1 is a block diagram of a non-volatile memory system 100 according to some embodiments of the present inventive concept. The non-volatile memory system 100 includes a non-volatile memory device 120 and a memory controller 110 for controlling the non-volatile memory device 120.

The non-volatile memory device 120 includes a memory cell array 230, an address decoder 240, a data write driver/sense amplifier (SA) circuit 250, a chip controller 260, a voltage generator 270, and input/output (I/O) circuit 280.

The memory controller 110 includes a static random access memory (SRAM) 111, a central processing unit (CPU) 112, a host interface (I/F) 113, a control module 114, and a memory I/F 115.

The host I/F 113 includes an interface protocol to communicate with a host. The SRAM 111 stores data and/or a program in a volatile state. The memory I/F 115 interfaces with the non-volatile memory device 120. The CPU 112 performs overall control of writing data to and/or reading data from the non-volatile memory device 120.

The control module 114 controls the chip controller 260 to control the level of a first pass voltage applied to at least one word line adjacent to a selected word line based on the level of the read voltage applied to the selected word line. The chip controller 260 may directly or indirectly control the voltage generator 270 to change the level of the first pass voltage to a predetermined voltage level to be applied having the predetermined level to the at least one word line adjacent to the selected word line.

The memory cell array 230 includes a main area 231 and a spare area 232. The main area 231 may be used to store user data and is thus referred to as a user data area. The spare area may be used to store error correcting code (ECC) data and the level of the read voltage.

The address decoder 240 selects one word line from among a plurality of word lines in response to a row address, and provides the read voltage to the selected word line, and provides the first pass voltage to at least one word line adjacent to the selected word line among unselected word lines, and provides a second pass voltage to the remaining unselected word lines. At this time, the first pass voltage may be equal to or higher than the second pass voltage. The read voltage may be a verify read voltage used in incremental step pulse programming (ISPP) or a read voltage used in a random access data read operation.

The write driver/SA circuit 250 is connected to a plurality of bit lines to program data into selected memory cells or to read data from the selected memory cells by sensing and amplifying the data. The write driver/SA circuit 250 may include a plurality of data storage cells (not shown) that input-buffer a data set to be programmed during a program operation and output-buffer a data set that has been read from memory cells during a read operation. Each of the data storage cells may include a plurality of latches. The data storage cells may also output-buffer a data set that has been read during a program verify operation.

A switching block (not shown) may also be provided between the write driver/SA circuit 250 and the memory cell array 230 to alternately connect the write driver and the SA to the bit lines.

The chip controller 260 outputs internal control signals (not shown) for controlling the operations (e.g., the program operation, the erase operation, and the read operation) of the non-volatile memory device 120 in response to external commands. The voltage generator 270 generates operation voltages (e.g., a program voltage, a pass voltage, and a read voltage) necessary for the operations of the non-volatile memory device 120. The voltages generated by the voltage generator 270 may comprise a program operation voltage, a read operation voltage and a verify operation voltage.

The chip controller 260 controls the voltage generator 270 to change the level of the first pass voltage to the predetermined level and then provides the first pass voltage to at least one word line adjacent to the currently selected word line according to the control of the memory controller 110, but the present inventive concept is not restricted thereto. For instance, the chip controller 260 may control the voltage generator 270 to change the level of the first pass voltage to the predetermined level and then provide the first pass voltage to at least one word line adjacent to the selected word line, according to the control of the chip controller 260 and without the control of the memory controller 110.

The I/O circuit 280 interfaces with an external device, (e.g., the memory controller 110). The I/O circuit 280 may receive commands and the data to be programmed from the external device and may transmit a state signal and the data that has been read to the external device.

The memory controller 110 controls overall data exchange between the host and the non-volatile memory device 120. For instance, the memory controller 110 controls the non-volatile memory device 120 according to the control of the host to write data or read data.

Figure 2:
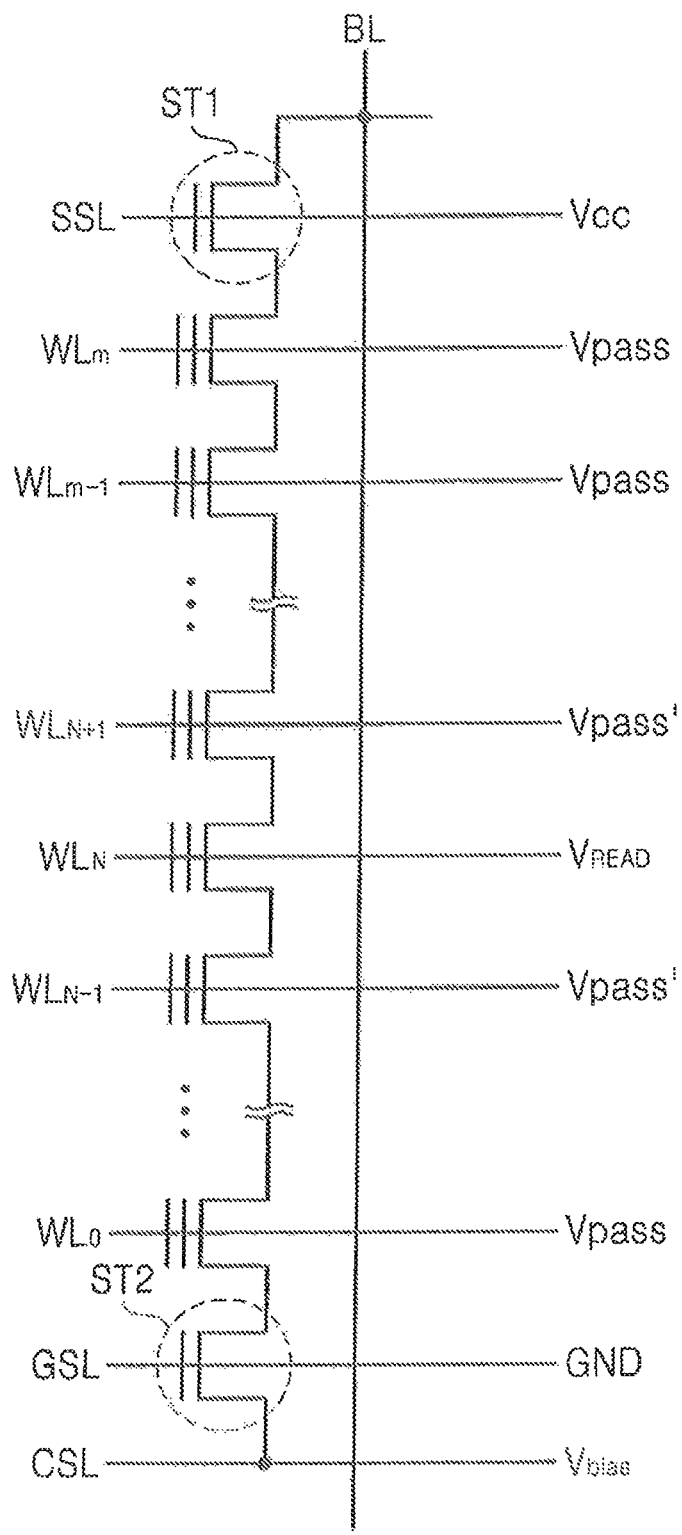
FIG. 2 is a circuit diagram of a NAND string of memory transistors in the memory cell array 231 of a non-volatile memory device according to some embodiments of the present inventive concept.

FIG. 2 is a circuit diagram of a NAND string of memory transistors in the memory cell array 231 of the non-volatile memory device 120 according to some embodiments of the present inventive concept. FIG. 2 shows a single NAND string in the memory cell array 231.

Referring to FIG. 2, a read voltage $V_{READ}$ output from the voltage generator 270 is provided to the currently selected word line $WL_N$ among the plurality of word lines $WL_0$ through $WL_m$. A first pass voltage $V_{pass'}$ is provided to at least one word line among word lines $WL_{N-1}$ and $WL_{N+1}$ adjacent to the selected word line $WL_N$. A second pass voltage $V_{pass}$ is provided to the remaining unselected word lines.

The level of the first pass voltage $V_{pass'}$ may be higher than the level of the second pass voltage $V_{pass}$, as will be described in detail with reference to FIG. 5 below.

A power supply voltage Vcc is applied to a string selection line SSL connected to the gate of a first selection transistor ST1. A ground voltage GND is applied to a ground selection line GSL connected to the gate of a second selection transistor ST2. A predetermined bias voltage $V_{bias}$ is applied to a common source line CSL.

Figure 3:
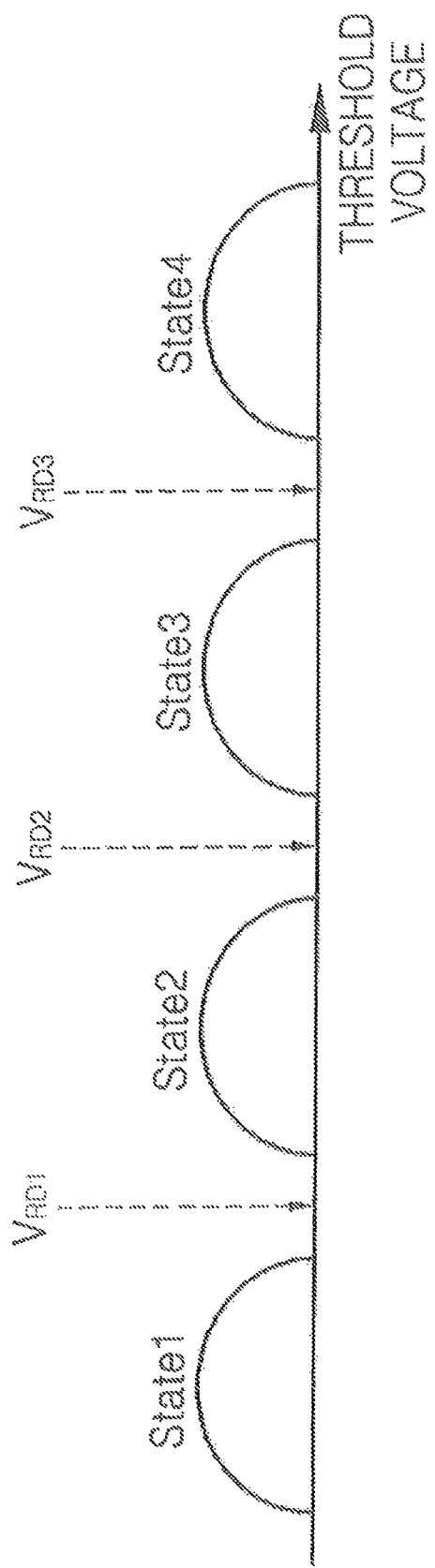
FIG. 3 is a threshold voltage distribution diagram showing an example of threshold voltage distributions of four logic states of the memory cells in the memory array 231 of the memory system of FIG. 1.
Figure 4:
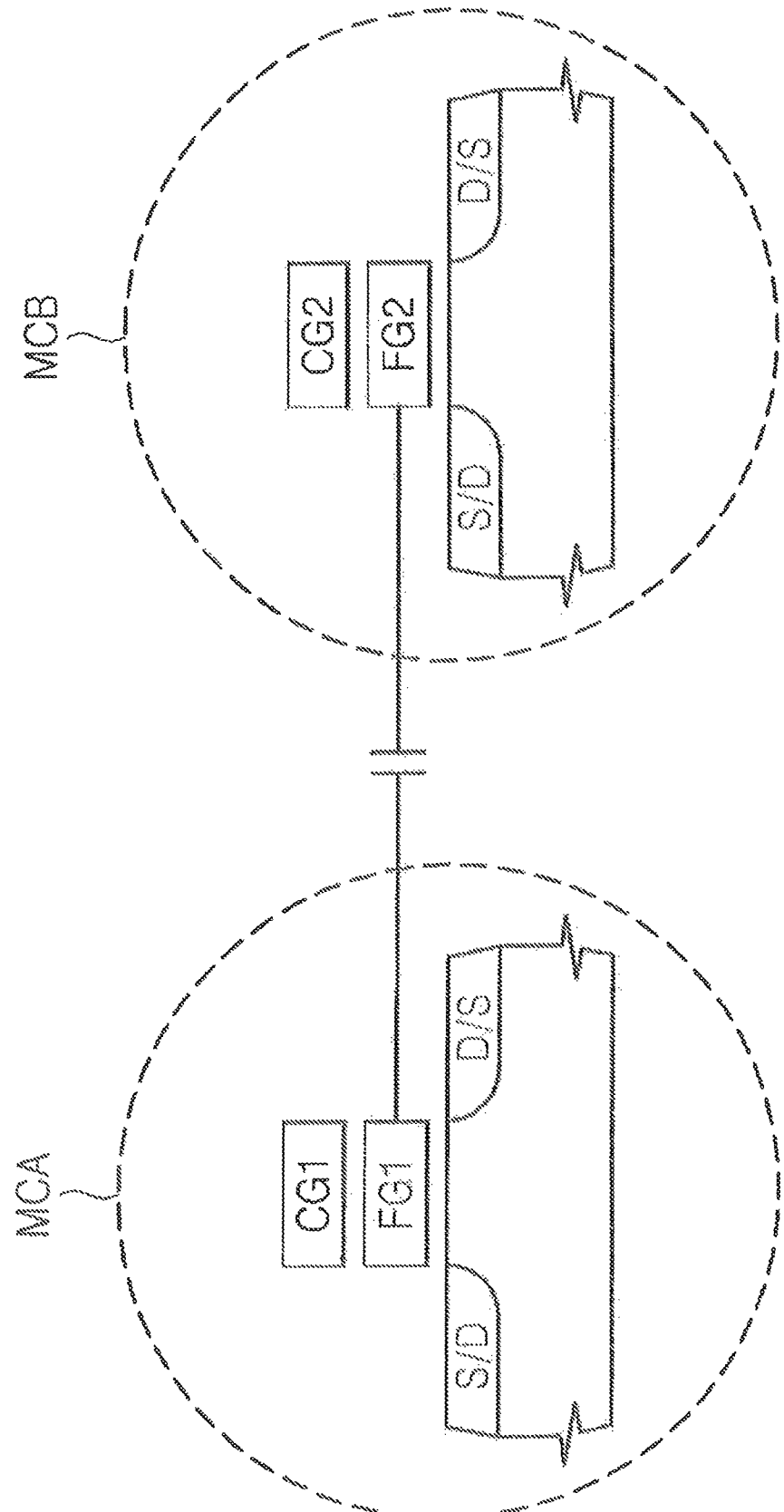
FIG. 4 is a cross sectional view of two adjacent memory transistors in the NAND string of FIG. 2.

FIG. 3 is a threshold voltage distribution diagram showing an example of threshold voltage distribution states of the memory cells in the memory array 231 of the memory system of FIG. 1. FIG. 4 is a cross section of two adjacent memory transistors in the NAND string of FIG. 2 for explaining F-poly coupling occurring between memory cells.

Referring to FIG. 3, a multi-level cell (MLC), has four logic states, and each state has a threshold voltage distribution. FIG. 3, shows the threshold voltage distributions corresponding to a first logic state State1, a second logic state State2, a third logic state State3, and a fourth logic state State4. The threshold voltage distribution corresponding to each of the first through fourth logic states State1 through State4 is wider than desired, leaving a narrower margin between adjacent states, due to various causes. For instance, the threshold voltage distribution may be wider due to coupling, e.g., F-poly coupling, between adjacent memory cells during programming.

Referring to FIG. 4, the first memory cell MCA is a memory cell that has been programmed to be in one of the first through fourth logic states State1 through State4 and the second memory cell MCB is a memory cell that will be programmed to be in one of the first through fourth logic states State1 through State4.

When the second memory cell MCB is programmed, charges are accumulated at a floating gate FG2 of the second memory cell MCB. At this time, the voltage potential of a floating gate FG1 of the first memory cell MCA adjacent to the second memory cell MCB may be increased due to coupling with the floating gate FG2 of the second memory cell MCB. Such an increased threshold voltage is still maintained by the coupling between the floating gates FG1 and FG2 even after the programming. Here, the second memory cell MCB may be any one of memory cells adjacent to the first memory cell MCA in a word line direction or in a bit line direction. The threshold voltage of the first memory cell MCA that has been programmed may be increased due to the coupling, and therefore, the threshold voltage distribution may be wider, and the threshold voltage value may be increased by more than one adjacent memory cells due to the randomness of the data programmed into adjacent memory cells. Consequently, a fail may occur in reading the first memory cell MCA.

Figure 5:
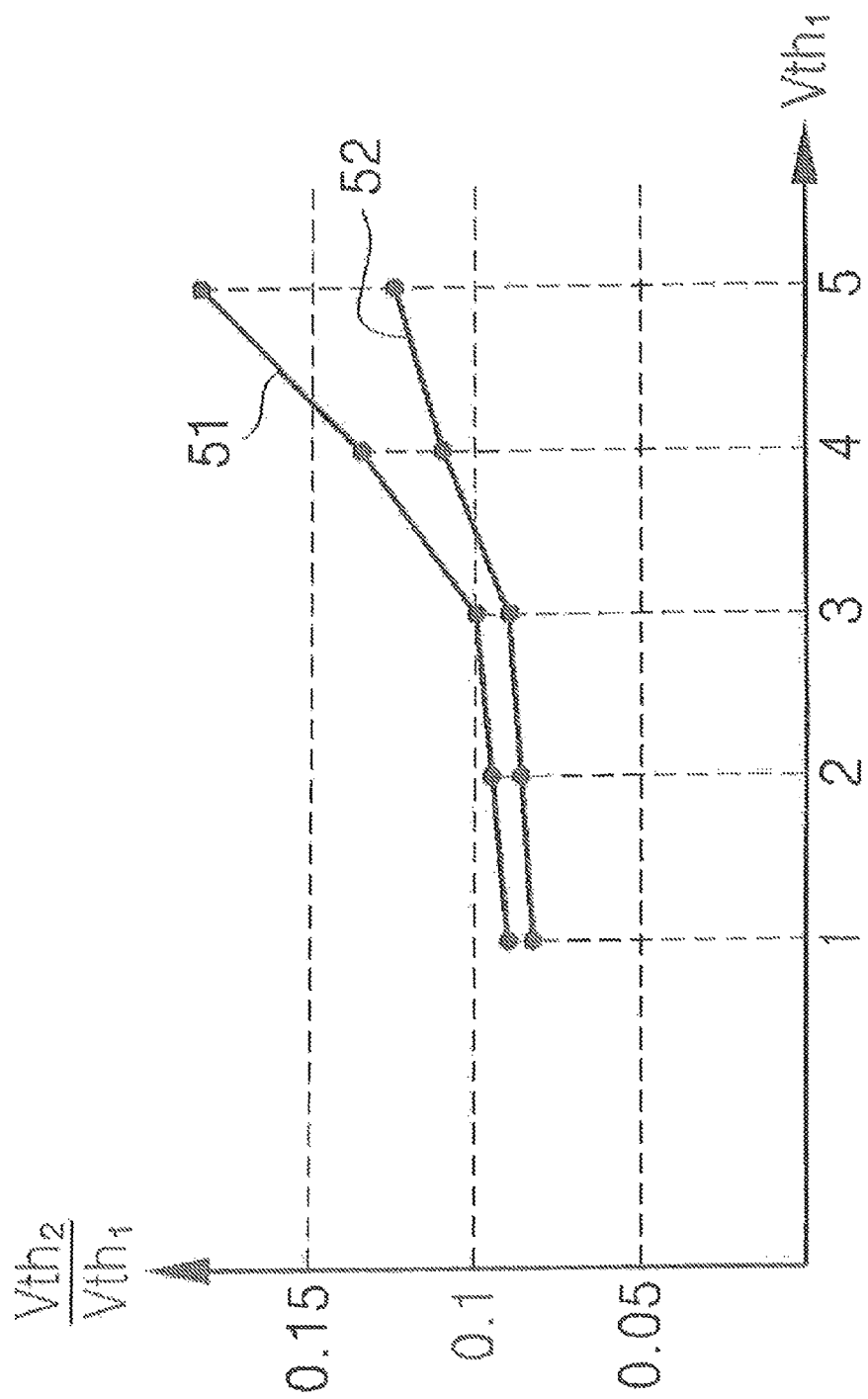
FIG. 5 is a graph of threshold voltage ratios for explaining the effect of a memory system according to some embodiments of the present inventive concept.

FIG. 5 is a graph for explaining the effect in a memory system according to some embodiments of the present inventive concept. Referring to FIGS. 2 and 5, the first pass voltage $V_{pass'}$ higher than the second pass voltage $V_{pass}$ is provided to a word line (e.g., $WL_{N-1}$) adjacent to the selected word line $WL_N$. For instance, when the second pass voltage $V_{pass}$ is 7 V, the first pass voltage $V_{pass'}$ may be 8 V (i.e., higher than 7 V).

FIG. 5 shows a ratio $$\frac{V_{th2}}{V_{th1}}$$

of the threshold voltage $V_{th2}$ of a memory cell positioned at the selected word line $WL_N$ to a threshold voltage $V_{th1}$ of a memory cell positioned at the unselected word line $WL_{N-1}$ adjacent to the selected word line $WL_N$ as a function of the threshold voltage $V_{th1}$ of the memory cell positioned at the unselected word line $WL_{N-1}$ adjacent to the selected word line $WL_N$. In other words, the x-axis indicates the threshold voltage $V_{th1}$ and the y-axis indicates $$\frac{V_{th2}}{V_{th1}}$$

in FIG. 5. The ratio $$\frac{V_{th2}}{V_{th1}}$$

is lower for all values of the threshold voltage $V_{th1}$ when the first pass voltage $V_{pass'}$ is 8 V (curve 52) than when the first pass voltage $V_{pass'}$ is 7 V (curve 51).

Accordingly, it can be inferred that the threshold voltage of a memory cell positioned at the selected word line $WL_N$ is less affected by coupling when the first pass voltage $V_{pass'}$ is 8 V than when the first pass voltage $V_{pass'}$ is 7 V.

Figure 6:
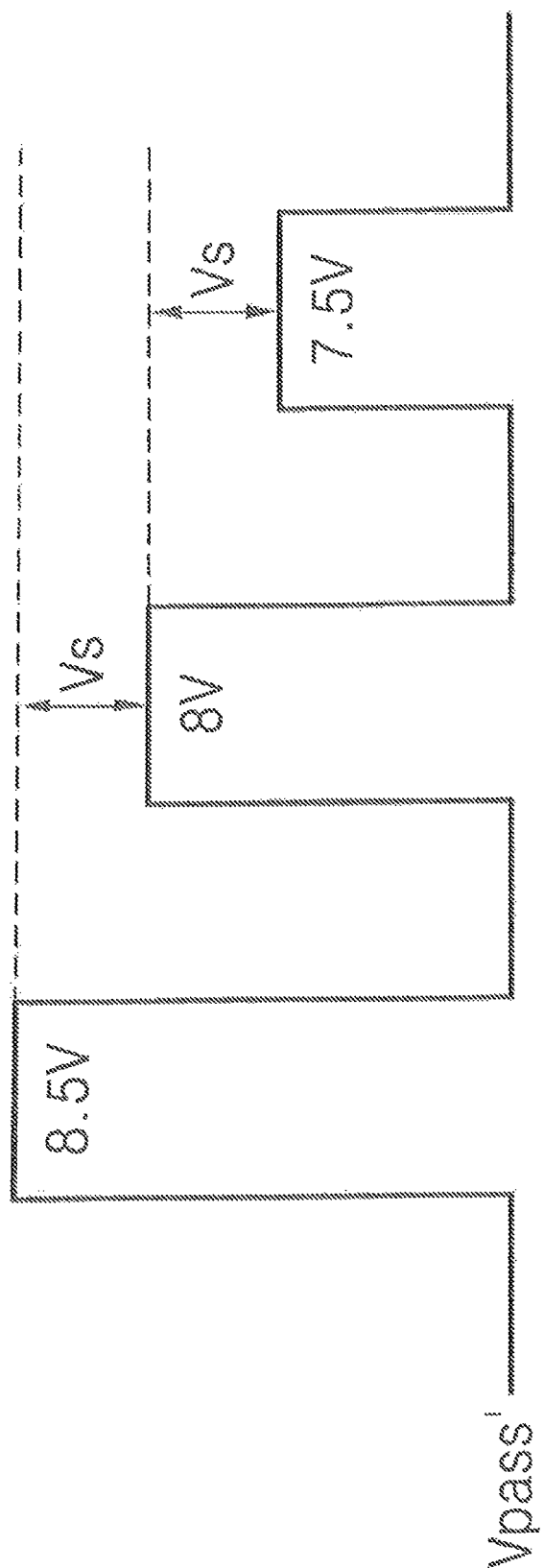
FIG. 6 is a voltage diagram showing the different levels of pass voltages provided to unselected word lines adjacent to the currently selected word line in some embodiments of the present inventive concept.

FIG. 6 is a voltage diagram showing the different levels of pass voltages provided to unselected word lines adjacent to the currently selected word line in some embodiments of the present inventive concept.

Referring to FIGS. 3 and 6, the first pass voltage $V_{pass'}$ is applied to the unselected word lines adjacent to the selected word line at different levels. For instance, when a first read voltage $V_{RD1}$ is applied to the selected word line, the first pass voltage $V_{pass'}$ may be 8.5 V. When a second read voltage $V_{RD2}$ is applied to the selected word line, the first pass voltage $V_{pass'}$ may be 8 V. When a third read voltage $V_{RD3}$ is applied to the selected word line, the first pass voltage $V_{pass'}$ may be 7.5 V.

At this time, the level difference $V_S$ between the different values of the first pass voltage $V_{pass'}$ may have a predetermined constant difference value and is 0.5 V in FIG. 6.

As described above, when the first pass voltage $V_{pass'}$ is applied at different levels according to the level of a read voltage, a read disturb problem can is be mitigated.

Figure 7:
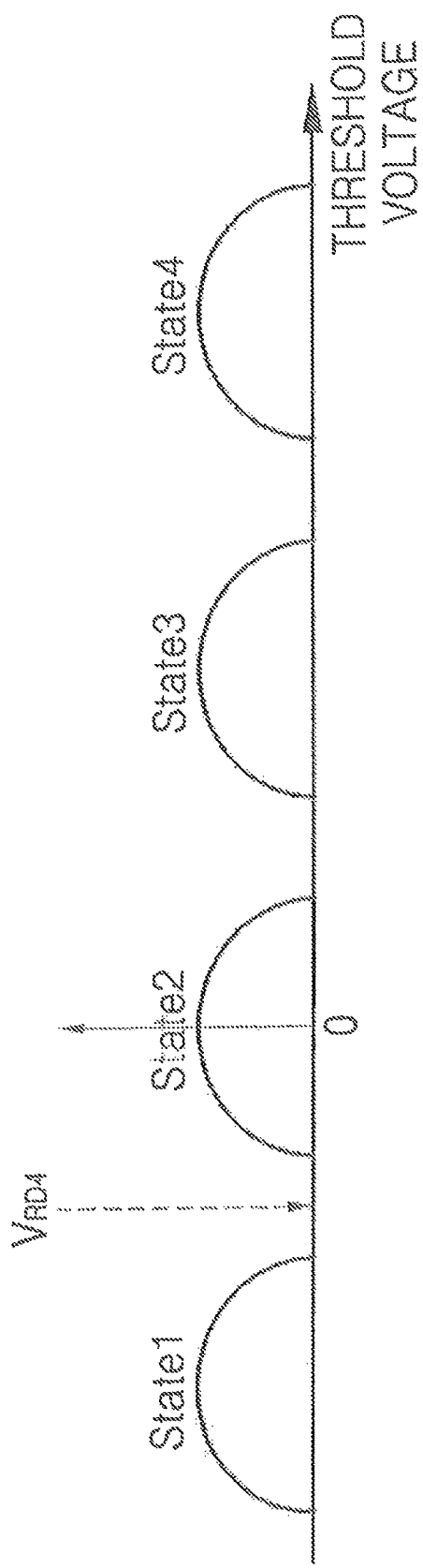
FIG. 7 is a threshold voltage distribution diagram showing another example of threshold voltage distributions of the four logic states of memory cells in the memory array 231 of the memory system of FIG. 1.
Figure 8:
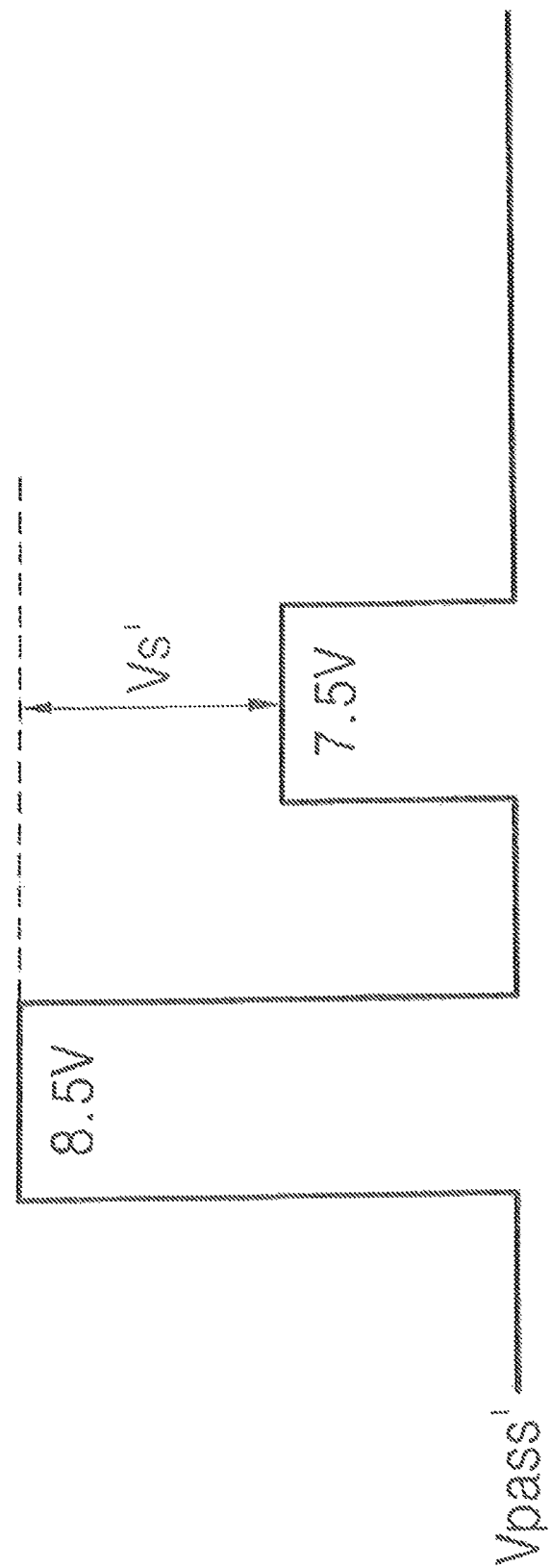
FIG. 8 is a voltage diagram showing different pass voltages provided to unselected word lines adjacent to the selected word line so that the threshold voltage distribution states are as shown in FIG. 7, in other embodiments of the present inventive concept.

FIG. 7 is a threshold voltage distribution diagram showing different threshold voltage distributions of the four logic states of the MLC memory cells in the memory array 231 of the memory system of FIG. 1. FIG. 8 is a voltage diagram showing different pass voltages provided to unselected word lines adjacent to the currently selected word line when the threshold voltage distribution of logic states are as shown in FIG. 7, in other embodiments of the present inventive concept.

Referring to FIGS. 7 and 8, the first state State1 having the threshold voltage distribution shown in FIG. 7 has a negative threshold voltage unlike the example shown in FIG. 3.

At this time, the threshold voltage distribution of logic states may be divided into the first state State1 having the negative threshold voltage and the other states, i.e., the second through fourth state State2 through State4 having positive threshold voltages. In this case, when a fourth read voltage $V_{RD4}$ is applied to read the first state State1, the first pass voltage $V_{pass'}$ may be 8.5 V; otherwise, the first pass voltage $V_{pass'}$ may be 7.5 V.

At this time, the level difference $V_{S'}$ in the first pass voltage $V_{pass'}$ may have a predetermined constant difference value and is 1 V in FIG. 8.

FIG. 9A is a flowchart of a method of providing an operating voltage in a semiconductor memory device according to some embodiments of the present inventive concept.

Referring to FIG. 9A, a read voltage is applied to a selected word line in step S100. At this time, the read voltage may be a verify read voltage used in ISPP or a read voltage used in a random data access read operation.

A first pass voltage is applied to at least one of word lines adjacent to the selected word line in step S200. A second pass voltage is applied to the remaining word lines other than the selected word line and the at least one word line to which the first pass voltage is applied in step S300. The first pass voltage may be equal to or higher than the second pass voltage. The steps S100, S200, and S300 may be commenced sequentially (one step commenced after the prior has been commenced) or alternately may be commenced in parallel (commenced at substantially the same time). In practice the first pass voltage is applied to at least one of the unselected word lines adjacent to the selected word line (in step S200) while the second pass voltage is applied to the remaining unselected word lines (in step S300) while the read voltage is applied to the selected word line (in step S100).

FIG. 9B is a flowchart detailing substeps of step S200 in the method of FIG. 9A. Referring to FIG. 1 and FIGS. 9A and 9B, in step S210, the non-volatile memory device 120 detects or identifies the read voltage applied to the selected word line according to the control of the memory controller 110 or the chip controller 260. In step S220, the non-volatile memory device 120 changes and applies the first pass voltage based on the level of the read voltage obtained as a result of the detection or identification. For instance, as the level of the read voltage is higher, the non-volatile memory device 120 may apply the first pass voltage which is lower or higher. The level difference (increment VS') in the first pass voltage may have a predetermined constant value.

Figure 10:
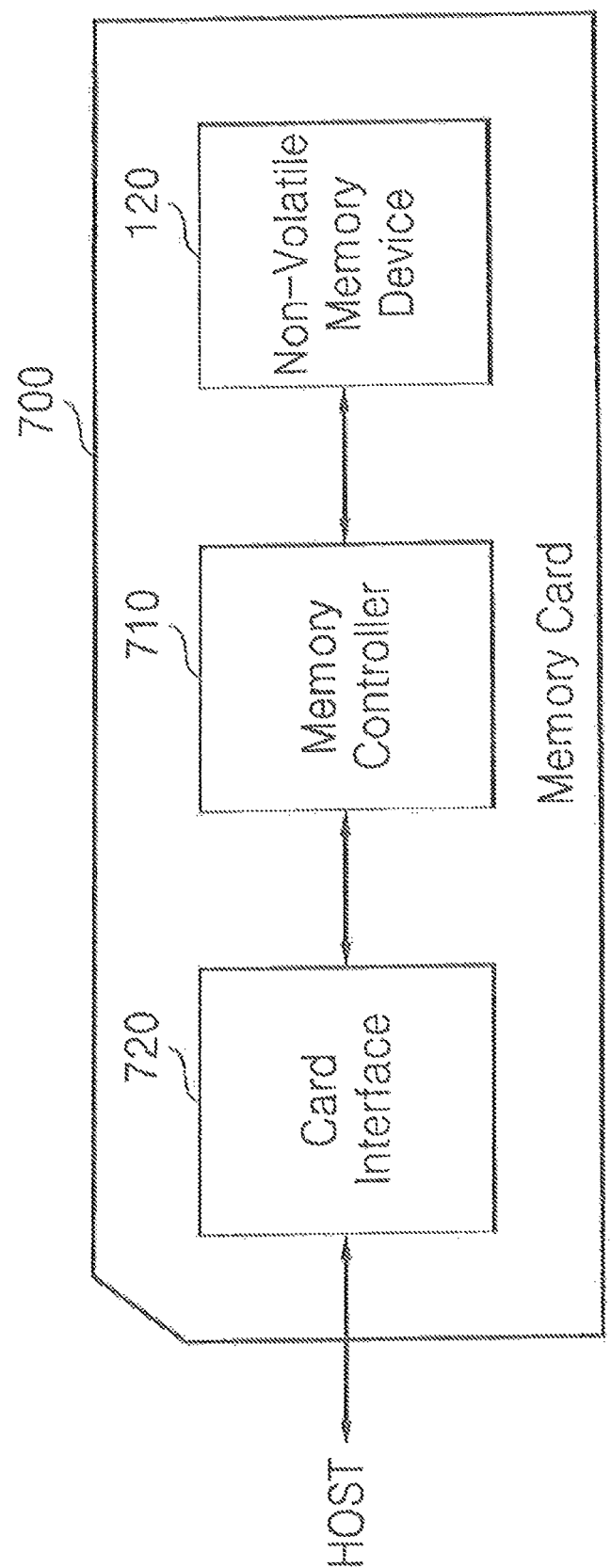
FIG. 10 is a block diagram of a memory card including the non-volatile memory device 120 shown in FIG. 1 according to an exemplary implementation of the memory system of FIG. 1.

FIG. 10 is a block diagram of a memory card including the non-volatile memory device 120 shown in FIG. 1 according to an exemplary implementation of the memory system of FIG. 1. The memory card 700 shown in FIG. 10 is implemented as a flash memory card. The memory card 700 may includes non-volatile memory device 120 that can control the operating voltages applied to the selected and adjacent unselected word lines as explained above, a memory controller 710, and a card interface 720 to interface with a host.

The memory controller 710 controls data transmission between the non-volatile memory device 120 and the card interface 720.

In some an exemplary implementations, the memory card 700 of FIG. 10 may be implemented as a smart card.

According to an exemplary implementation, the card interface 720 may be a secure digital (SD) card interface or a multi-media card (MMC) interface. However, implementation are not limited thereto. The card interface 720 may interface for data exchange between the host and the memory controller 710 according to a communication protocol.

When the memory card 700 is connected to a host, e.g., a PC, a tablet PC, a digital camera, a digital audio player, a cellular phone, a console video game hardware, a digital set-top box, and so forth, the memory controller 710 of the memory card 700 may transmit or receive data stored in the non-volatile memory device 120 with the host.

Figure 11:
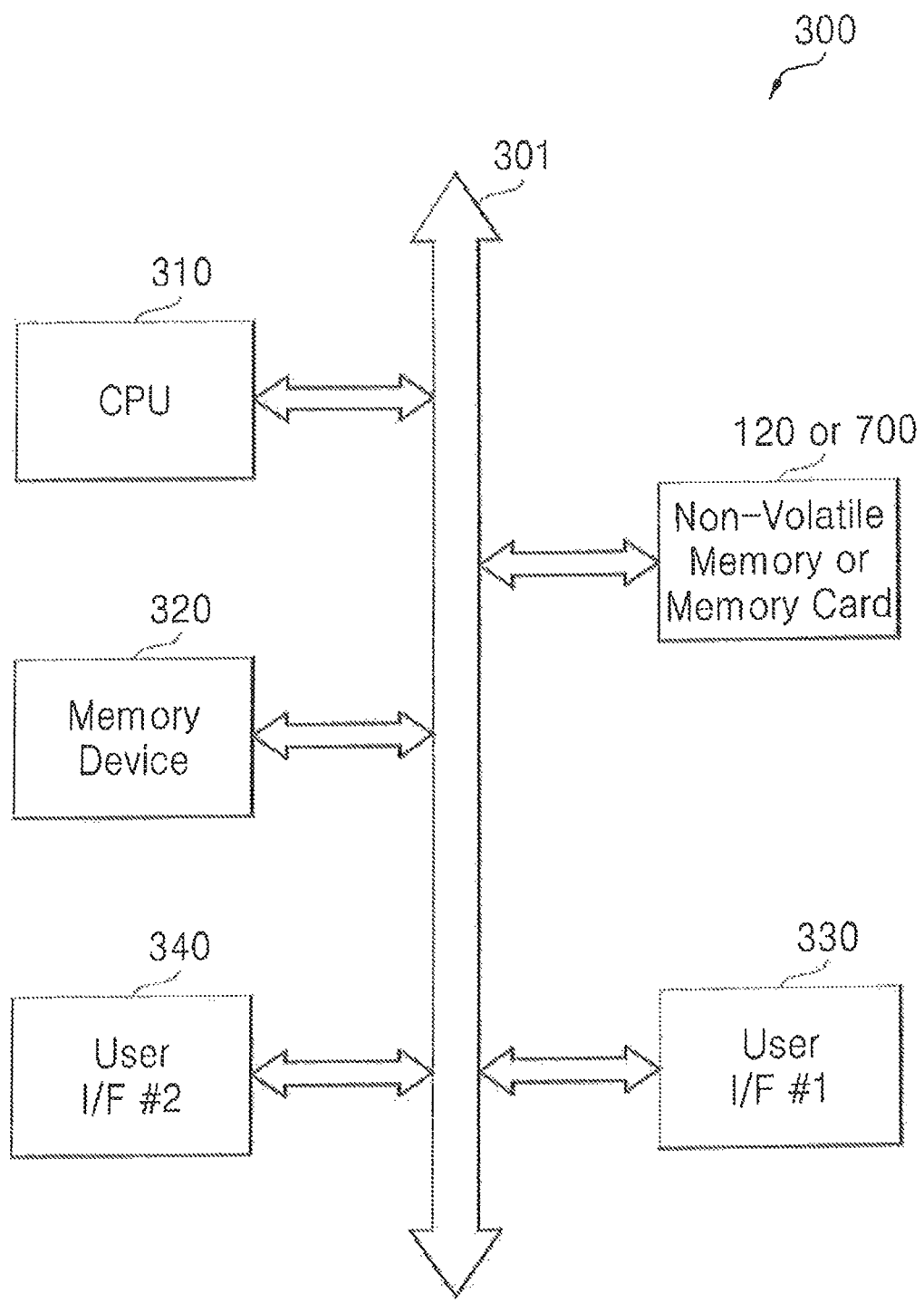
FIG. 11 is a block diagram of a computer system including the non-volatile memory of FIG. 1 or FIG. 10 according to another exemplary implementation.

FIG. 11 illustrates a block diagram of a memory system 300 including the non-volatile memory device 120 shown in FIG. 1 or the memory card 700 of FIG. 10 according to various other exemplary embodiments.

Referring to FIG. 11, the memory system 300 may be implemented in the form of a cellular phone, a smart phone, a PDA (personal digital assistant), a digital camera, a portable game console, a MP3 player, a HDTV (High-definition television), a GPS (Global Positioning System), a navigator, a CE (consumer equipment), a digital settop box) or an IT (information technology) device.

The memory system 300 may include a CPU 310 and a non-volatile memory device 120 which are connected with each other through a system bus 301. According to another exemplary embodiment, the memory system 300 may include the CPU 310 and the memory card 700 of FIG. 10, which are connected with each other through the system bus 301.

The CPU 310 may control operations of the non-volatile memory device 120, e.g., a program operation, a read operation, an erase operation or an operation of transmitting data to the host. Alternatively, the memory controller 710 of the memory card 700 may control operations of the non-volatile memory device 120, e.g., a program operation, a read operation, an erase operation or an operation of transmitting data to the host.

The memory device 320 connected to the bus 301 may be used as the random access system memory (RAM) of the CPU 310. The memory device 320 may be a DRAM, or a SRAM. The memory device 320 may be a memory module e.g., a SIMM (single in-line memory module) or a DIMM (dual in-line memory module). In alternative embodiments, the memory device 320 may be a memory module that includes a plurality of the non-volatile memory device 120 illustrated in FIG. 1.

The memory system 300 may include a first user interface 330 such as a display or a touch pad. And, the memory system 300 may further include a second user interface 340 such as an input/output interface. The second user interface 340 may be an output device such as a printer or an input device such as a keyboard or a mouse. According to an exemplary embodiment, the first user interface 330 may be replaced with a CMOS image sensor. The CMOS image sensor may convert an optical image to a digital image, and the digital image will be stored in the memory device 120 (or the memory card 700) under control of the CPU 310.

Figure 12:
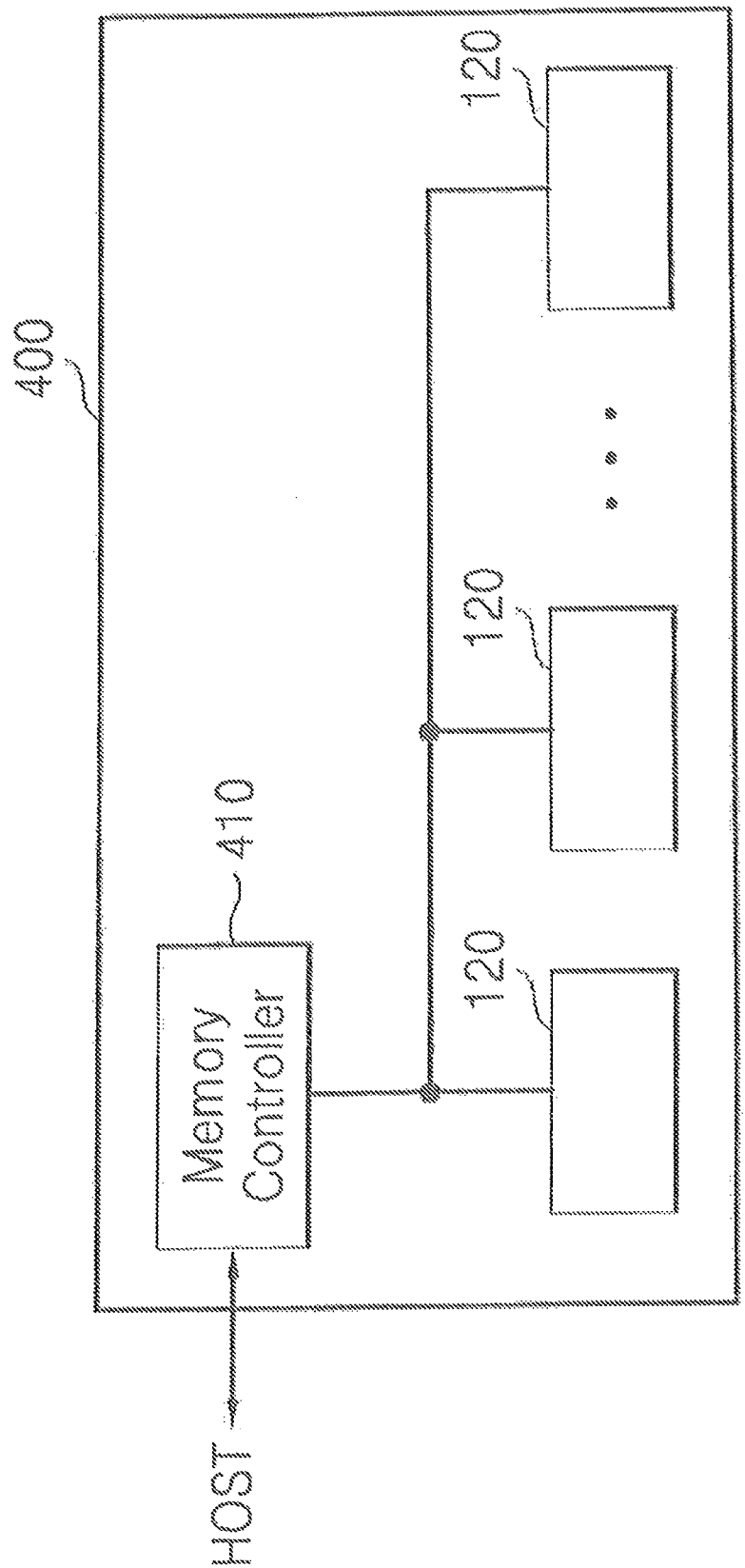
FIG. 12 is a block diagram of a memory system 400 implementing a solid state drive (SSD) and including the non-volatile memory device 120 shown in FIG. 1 according to still another exemplary implementation.

FIG. 12 is a block diagram of a memory system 400 implementing a solid state drive (SSD) and including the non-volatile memory device 120 shown in FIG. 1 according to still another exemplary implementation. Referring to FIG. 12, the memory system 400 implements a solid state drive (SSD).

The memory system 400 may include a plurality of non-volatile memory devices 120 and a memory controller 410 controlling the data access functions of each of the plurality of non-volatile memory devices 120. Each of the plurality of non-volatile memory devices 120, under the control of the memory controller 410, can adaptively control access functions to determine or verify whether a selected non-volatile memory cell among a plurality of non-volatile memory cells included in each of the plurality of non-volatile memory devices 120 is programmed or erased.

Figure 13:
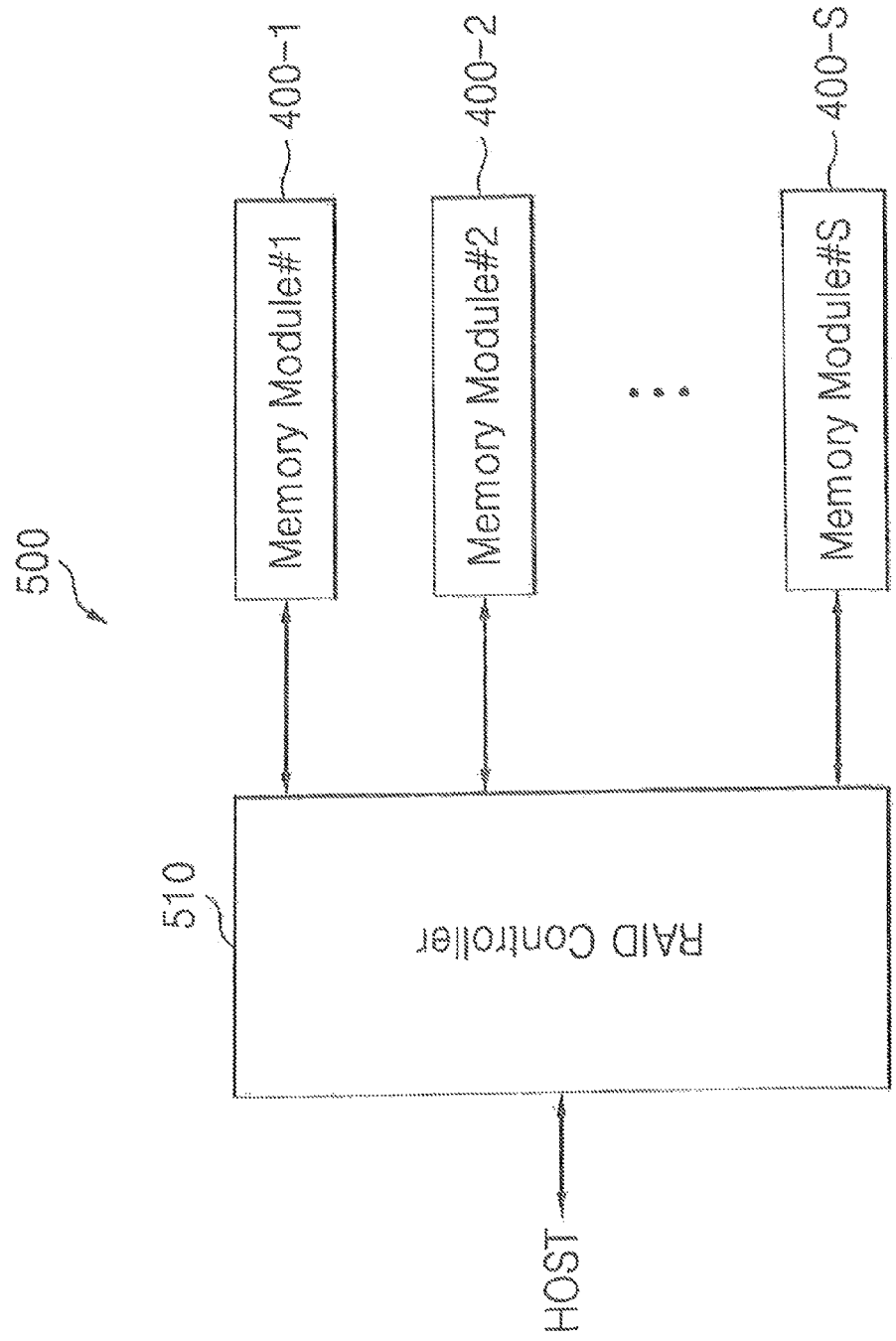
FIG. 13 is a block diagram of a RAID array including a plurality of the memory system 400 of FIG. 12.

FIG. 13 is a block diagram of a RAID array including a plurality of the memory system 400 of FIG. 12. Referring to FIGS. 12 and 13, a RAID array 500 may be a redundant array of independent disks (RAID) system that includes a RAID controller 510 and a plurality of memory systems 400-1 to 400-S of FIG. 12, where S is a natural number.

Each of the plurality of memory systems 400-1 to 400-S may alternatively be a memory card 700 of FIG. 10. The plurality of memory systems 400-1 to 400-S may compose a RAID array having a user selected redundancy level (RAID level). Each of the plurality of memory systems 400-1 to 400-S includes one of the memory controller 410 of FIG. 12 to control the function of the plurality of the non-volatile memory devices 120 therein. The RAID controller 510 controls the function of the plurality of memory systems 400-1 to 400-S. The RAID array 500 may be included in a personal computer (PC) or in one SSD unit for use therein.

During a write (or program) operation, the RAID controller 510 outputs a write (or program) data output command from the host to one or more of the plurality of memory systems 400-1 to 400-S according to a selected one of a plurality of RAID levels in response to a write (or program) command output from the host.

Additionally, during a read operation, the RAID controller 510 may transmit data read from one or more of the plurality of memory systems 400-1 to 400-S to the host according to the selected one of a plurality of RAID levels in response to a read command output from the host.

The present inventive concept may be implemented with hardware such as modules, or software such as algorithm or firmware. The algorithm or firmware may be implemented as computer readable codes and/or programs on a computer readable recording medium. The method of providing an operating voltage in a semiconductor memory device according to some embodiments may be implemented by executing the computer program for executing the method of providing an operating voltage in a semiconductor memory device stored in the computer readable recording medium.

The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and/or executed in a distributed fashion. Also, functional programs, codes, and/or code segments for realizing embodiments can be easily construed by programmers skilled in the art to which the embodiments pertain.

As described above, according to some embodiments of the present inventive concept, the characteristic of the threshold voltage distribution of the logic states of multilevel memory cells (MLCs) is improved.

Exemplary embodiments have been disclosed herein, and although specific terms are employed, they are used and are to be interpreted in a generic and descriptive sense only and not for purpose of limitation. In some instances it would be apparent to one of ordinary skill in the art viewing of the present application, that features, characteristics, and/or elements described in connection with a particular embodiment may be used singly or in combination with features, characteristics, and/or elements described in connection with other embodiments unless otherwise specifically indicated. Accordingly, it will be understood by those of skill in the art viewing of the present application that various changes in form and details may be made without departing from the spirit and scope of the present inventive concept as set forth in the following claims.

What is claimed is:

1. A method of performing a read operation on a nonvolatile memory device, the read operation comprising:

performing a first read operation, the first read operation including:

applying a first read voltage to a first word line connected to first memory cells in the nonvolatile memory device;

applying a first pass voltage to a second word line connected to second memory cells in the nonvolatile memory device while the first read voltage is applied to the first word line, the second word line being adjacent to the first word line; and applying a second pass voltage to a third word line connected to third memory cells in the nonvolatile memory device while the first read voltage is applied to the first word line, the second pass voltage being lower than the first pass voltage;

performing a second read operation, the second read operation including:

applying a second read voltage lower than the first read voltage to the first word line;

applying a third pass voltage to the second word line while the second read voltage is applied to the first word line, the third pass voltage being different from the first pass voltage; and applying a fourth pass voltage to the third word line while the second read voltage is applied to the first word line, the fourth pass voltage being substantially the same as the second pass voltage; and performing a third read operation, the third read operation including:

applying a third read voltage to the first word line, the third read voltage being different from the first and the second read voltages;

applying a fifth pass voltage to the second word line while the third read voltage is applied to the first word line, the fifth pass voltage being substantially the same as the first pass voltage; and applying a sixth pass voltage to the third word line while the third read voltage is applied to the first word line, the sixth pass voltage being substantially the same as the second pass voltage.

2. The method of claim 1, wherein at least one of the first memory cells has a first logic state having a negative threshold voltage distribution.

3. The method of claim 2, wherein the second read voltage is between a threshold voltage distribution of the first logic state and a threshold voltage distribution of a second logic state adjacent to the threshold voltage distribution of the first logic state.

4. The method of claim 1, wherein the nonvolatile memory device comprises a plurality of memory blocks that includes a first memory block, and the first memory cells, the second memory cells and the third memory cells are included in the first memory block.

5. The method of claim 1, wherein the third read voltage is higher than the second read voltage.

6. The method of claim 1, wherein the third read voltage is higher than the first read voltage.

7. The method of claim 1, wherein a difference between the first read voltage and the second read voltage is greater than a difference between the first pass voltage and the third pass voltage.

8. The method of claim 1, wherein the third pass voltage is lower than the first pass voltage.

9. The method of claim 1, wherein the first read operation further includes applying a seventh pass voltage to a fourth word line connected to fourth memory cells in the nonvolatile memory device while the first read voltage is applied to the first word line, the fourth word line being adjacent to the first word line, the seventh pass voltage being substantially the same as the first pass voltage, the second read operation further includes applying an eighth pass voltage to the fourth word line while the second read voltage is applied to the first word line, the eighth pass voltage being substantially the same as the first pass voltage, and the third read operation further includes applying a ninth pass voltage to the fourth word line while the third read voltage is applied to the first word line, the ninth pass voltage being substantially the same as the first pass voltage.

10. The method of claim 9, wherein a distance between the fourth word line and a string selection line connected to at least one string selection transistor is greater than a distance between the second word line and the string selection line, each of the at least one string selection transistor being connected to one of the first memory cells, connected to one of the second memory cells, connected to one of the third memory cells and connected to one of the fourth memory cells.

11. A method of reading a nonvolatile memory device, comprising:

performing a first read operation, the first read operation including:

applying a first read voltage to a first word line connected to first memory cells in the nonvolatile memory device;

applying a first pass voltage to a second word line connected to second memory cells in the nonvolatile memory device while the first read voltage is applied to the first word line, the second word line being adjacent to the first word line; and applying a second pass voltage to a third word line connected to third memory cells in the nonvolatile memory device while the first read voltage is applied to the first word line, the second pass voltage being lower than the first pass voltage; and performing a second read operation, the second read operation including:

applying a second read voltage to the first word line, the second read voltage lower than the first read voltage;

applying a third pass voltage to the second word line while the second read voltage is applied to the first word line, the third pass voltage being lower than the first pass voltage; and applying a fourth pass voltage to the third word line while the second read voltage is applied to the first word line, the fourth pass voltage being substantially the same as the second pass voltage.

12. The method of claim 11, further comprising performing a third read operation, the third read operation including:

applying a third read voltage to the first word line, the third read voltage being different from the first and the second read voltages;

applying a fifth pass voltage to the second word line while the third read voltage is applied to the first word line, the fifth pass voltage being substantially the same as the first pass voltage; and applying a sixth pass voltage to the third word line while the third read voltage is applied to the first word line, the sixth pass voltage being substantially the same as the second pass voltage, wherein at least one of the first memory cells has a first logic state having a negative threshold voltage distribution.

13. The method of claim 12, wherein the second read voltage is between a threshold voltage distribution of the first logic state and a threshold voltage distribution of a second logic state adjacent to the threshold voltage distribution of the first logic state.

14. The method of claim 11, wherein the nonvolatile memory device comprises a plurality of memory blocks that includes a first memory block, and the first memory cells, the second memory cells and the third memory cells are included in the first memory block.

15. The method of claim 12, wherein the third read voltage is higher than the second read voltage.

16. The method of claim 11, wherein a difference between the first read voltage and the second read voltage is greater than a difference between the first pass voltage and the third pass voltage.

17. A memory device comprising:
a memory cell array including a string of memory transistors connected to a plurality of word lines;
a voltage generator configured to generate voltages in the memory cell array; and
a chip controller configured to control the voltage generator to apply a first read voltage and/or a second read voltage to a selected word line among the plurality of word lines, to apply a first pass voltage and/or a second pass voltage to a first unselected word line among the plurality of word lines, the first unselected word line being adjacent to the selected word line, and to apply a third pass voltage to a second unselected word line among the plurality of word lines,
wherein the first read voltage is applied to the selected word line while the first pass voltage is applied to the first unselected word line,
the second read voltage is applied to the selected word line while the second pass voltage is applied to the first unselected word line, and
the first pass voltage is higher than the second pass voltage, and the first read voltage is higher than the second read voltage.

18. The memory system of claim 17, wherein the third pass voltage is applied to the second unselected word line while the first pass voltage is applied to the first unselected word line, and
the third pass voltage is also applied to the second unselected word line while the second pass voltage is applied to the first unselected word line.

19. The memory device of claim 17, wherein the voltage generator is configured to apply a fourth pass voltage to a third unselected word line among the plurality of word lines, the third unselected word line being adjacent to the selected word line, and
the fourth pass voltage is higher than the second pass voltage.

20. The memory device of claim 19, wherein a distance between the fourth word line and a string selection line connected to a string selection transistor is greater than a distance between the second word line and the string selection line, and
the string selection transistor is included in the string.

* * * * *